US011165983B1

(12) United States Patent
Park et al.

(10) Patent No.: US 11,165,983 B1
(45) Date of Patent: Nov. 2, 2021

(54) DATA READOUT WITH ACTIVE RESET FEEDBACK AMPLIFIER FOR STACKED IMAGE SENSOR (71) Applicant: OmniVision Technologies, Inc., Santa Clara, CA (US)

(72) Inventors: Geunsook Park, San Jose, CA (US); Chih-Wei Hsiung, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 0 days.

(21) Appl. No.: 17/066,051

(22) Filed: Oct. 8, 2020

(51) Int. Cl.
| H04N 5/335 | (2011.01) |
| H04N 5/378 | (2011.01) |
| H04N 5/3745 | (2011.01) |
| H01L 27/146 | (2006.01) |
| H04N 5/355 | (2011.01) |
| H04N 5/357 | (2011.01) |

(52) U.S. Cl.
CPC ....... *H04N 5/378* (2013.01); *H01L 27/14643* (2013.01); *H04N 5/3559* (2013.01); *H04N 5/3575* (2013.01); *H04N 5/3745* (2013.01)

(58) Field of Classification Search
CPC .... H04N 5/378; H04N 5/3745; H04N 5/3575; H04N 5/37452; H04N 5/3742; H04N 5/3559; H01L 27/14643; H01L 27/14609; H01L 27/14612
See application file for complete search history.

(56) References Cited

U.S. PATENT DOCUMENTS

| 9,894,297 B2 | 2/2018 | Kanehara et al. | |
| 2017/0134675 A1* | 5/2017 | Hynecek | H04N 5/37452 |
| 2017/0295338 A1* | 10/2017 | Geurts | H04N 5/363 |
| 2018/0176493 A1* | 6/2018 | Spivak | H04N 5/378 |

OTHER PUBLICATIONS

An Over 120dB Simultaneous-Capture Wide-Dynamic-Range 1.6e-Ultra-Low-Reset-Noise Organic-Photoconductive-Film CMOS Image Sensor/p. 110//Kazuko Nishimura,etal./Panasonic, Moriguchi, Japa.

* cited by examiner

*Primary Examiner* — Kelly L Jerabek (57) ABSTRACT

An image sensor comprises a pixel array of pixel cells. A pixel cell comprises a photodiode, a reset transistor, a transfer transistor, at least one source follower transistor, a sample and hold circuit, an active reset transistor, and a readout transistor. A readout circuitry reads out image data from each columns of pixel cells. A column differential amplifier in the readout circuitry feeds back a column reset drive voltage to each pixel cells arranged in the same column. Signal data of each pixel cells in the same column are read out globally when all the active reset transistors are switched off. Determined by switching configurations of each active reset transistors of pixel cells in the same column, noise data of each pixel cells in the same column are read out either globally or row-by-row. Final image data is achieved by applying the method of correlated double sampling (CDS).

27 Claims, 6 Drawing Sheets

DATA READOUT WITH ACTIVE RESET FEEDBACK AMPLIFIER FOR STACKED IMAGE SENSOR

TECHNICAL FIELD

This disclosure relates generally to Complementary Metal-Oxide-Semiconductor (CMOS) image sensors, and in particular but not exclusively, relates to apparatus and method applied to photodiode pixel cells and their pixel bitlines that are capable of eliminating one of the two storage capacitors for the reset signal during the readout of the image signal under Correlated Double Sampling (CDS) to reduce fixed pattern noise (FPN) when pixel size continues to shrink.

BACKGROUND INFORMATION

Image sensors have become ubiquitous. They are widely used in digital still cameras, cellular phones, security cameras, as well as medical, automobile, and other applications. Image sensors commonly utilize Complementary-Metal-Oxide-Semiconductor (CMOS) image sensors to capture image data of an imaged scene. CMOS devices include an array of pixels which are photosensitive to incident light from a scene for a particular amount of time. This exposure time allows charges of individual pixels to accumulate until the pixels have a particular signal voltage value, also known as the pixel grey value. These individual signal voltage values may then be correlated into digital image data representing the imaged scene.

Image quality is very important especially when the pixel size continues to shrink. To achieve higher quality, the increase of the number of pixels within the array provides one solution. To eliminate as much noise in the image data as possible provides the other. A common way in CMOS image sensors to reduce noise is correlated double sampling (CDS). CDS reduces the noise in the signal by calculating the difference between the signal voltage value (image grey value SHS), and a reset voltage value (image black background noise SHR) for the given pixel. Implementing CDS reduces the fixed pattern noise and other temporal noise, such as kTC thermal noise, from the image data. Correlated double sampling may be done in analog or digital domain.

Voltage domain global shutter pixel array normally uses two storage capacitors as memories for the reset voltage value SHR and signal voltage value SHS. To satisfy small kTC thermal noise requirement, the two storage capacitors need to maintain large enough layout size. Such a large layout size limits how small the pixel can shrink. If only one storage capacitor can be used alongside a few additional transistors, each pixel stands a better chance to be shrunk more.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of an apparatus and method for a fast settling pixel output line in an imaging sensor are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

Figure 1:
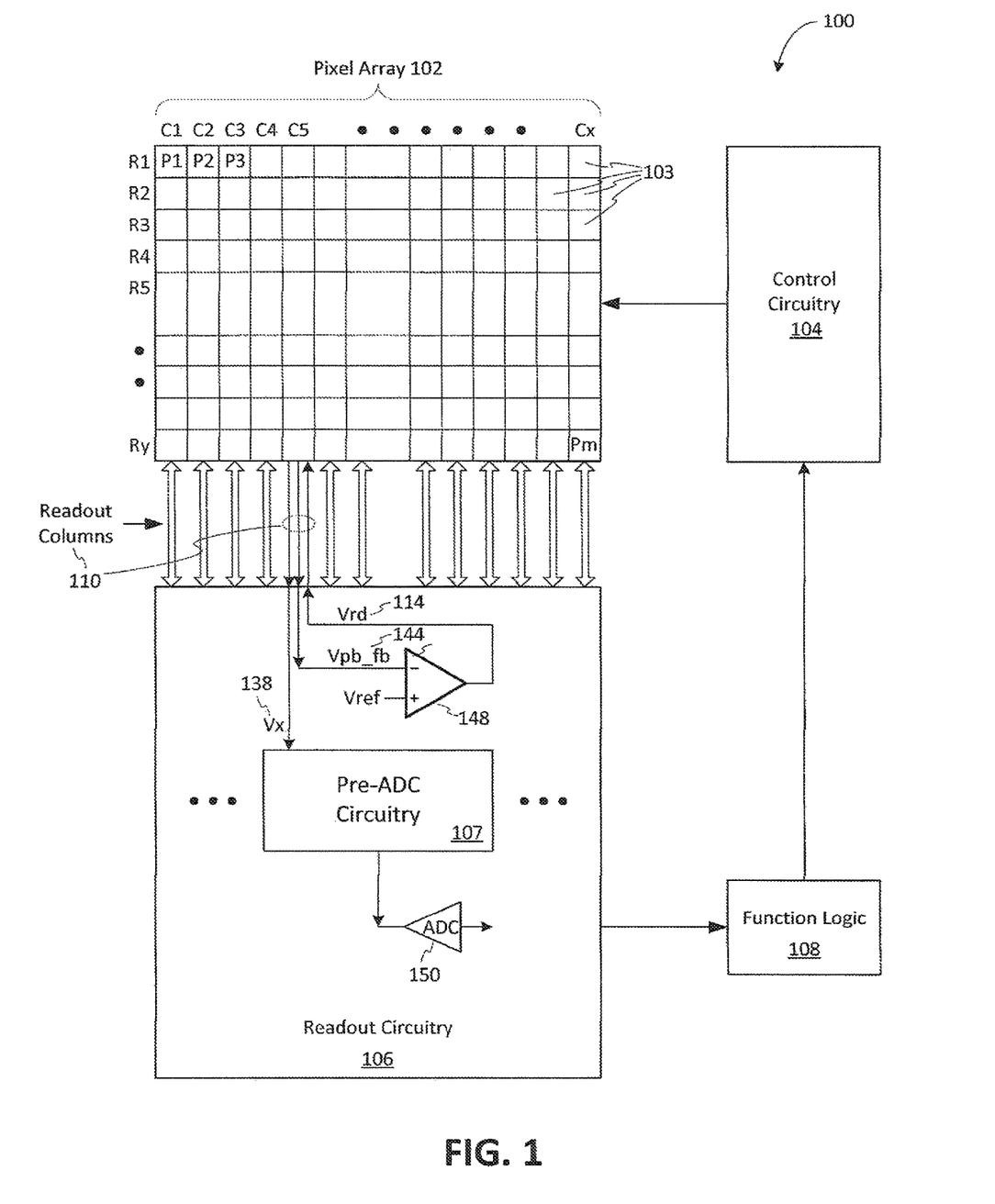
FIG. 1 illustrates one example of an imaging system in accordance with an embodiment of the present disclosure.

FIG. 1 illustrates one example of an imaging system 100 in accordance with an embodiment of the present disclosure.

Imaging system 100 includes pixel array 102, control circuitry 104, readout circuitry 106, and function logic 108. In one example, pixel array 102 is a two-dimensional (2D) array of image sensor pixel cells 103 (e.g., pixel cells P1, P2 . . . , Pm). Each of the plurality of pixel cells may comprise a photodiode to accumulate image charges in response to incident light. As illustrated, pixel cells 103 are arranged into rows (e.g., rows R1 to Ry) and columns (e.g., column C1 to Cx) to acquire image data of a person, place, object, etc., which can then be used to render a 2D image of the person, place, object, etc. However, pixel cells 103 do not have to be arranged into rows and columns and may take other configurations.

In one example, after each image sensor pixel cells 103 in pixel array 102 has acquired its image charge through photo-generation of the image charge, corresponding image data is readout by readout circuitry 106 and then transferred to function logic 108. Readout circuitry 106 may be coupled to readout image data from the plurality of photodiodes in pixel array 102. In various examples, readout circuitry 106 may comprise pre-analog-to-digital (pre-ADC) conversion circuitry 107, analog-to-digital (ADC) conversion circuitry 150 where such an ADC is one of the pluralities of ADCs coupled to each readout columns 110 as shown in FIG. 1, differential amplifier 148 where such an differential amplifier is one of the pluralities of differential amplifiers coupled to and from each readout columns 110 as shown in FIG. 1, or otherwise. In one example, readout circuitry 106 may read out a row of image data at a time along readout column lines 110 (illustrated) or may read out the image data using a variety of other techniques (not illustrated), such as a serial readout or a full parallel readout of all pixels simultaneously. Function logic 108 may store the image data or even manipulate the image data by applying post image effects (e.g., crop, rotate, remove red eye, adjust brightness, adjust contrast, or otherwise).

In some embodiments, function logic 108 may require certain imaging conditions to be met and may therefore instruct the control circuitry 104 to manipulate certain parameters in pixel array 102 to achieve better qualities or special effects.

In one example, each of the plurality of readout columns 110 may include three conductors. A first conductor may be a pixel signal conductor connected to each of a plurality of pixel signal outputs 138 of the plurality of pixel cells 103 arranged in the same column. A second conductor may be a pixel bitline feedback conductor connected to each of a plurality of pixel bitline feedback outputs 144 of the plurality of pixel cells 103 arranged in the same column. A third conductor may be a reset drive conductor connected to each of a plurality of reset drive inputs 114 of the plurality of pixel cells 103 arranged in the same column.

Figure 2:
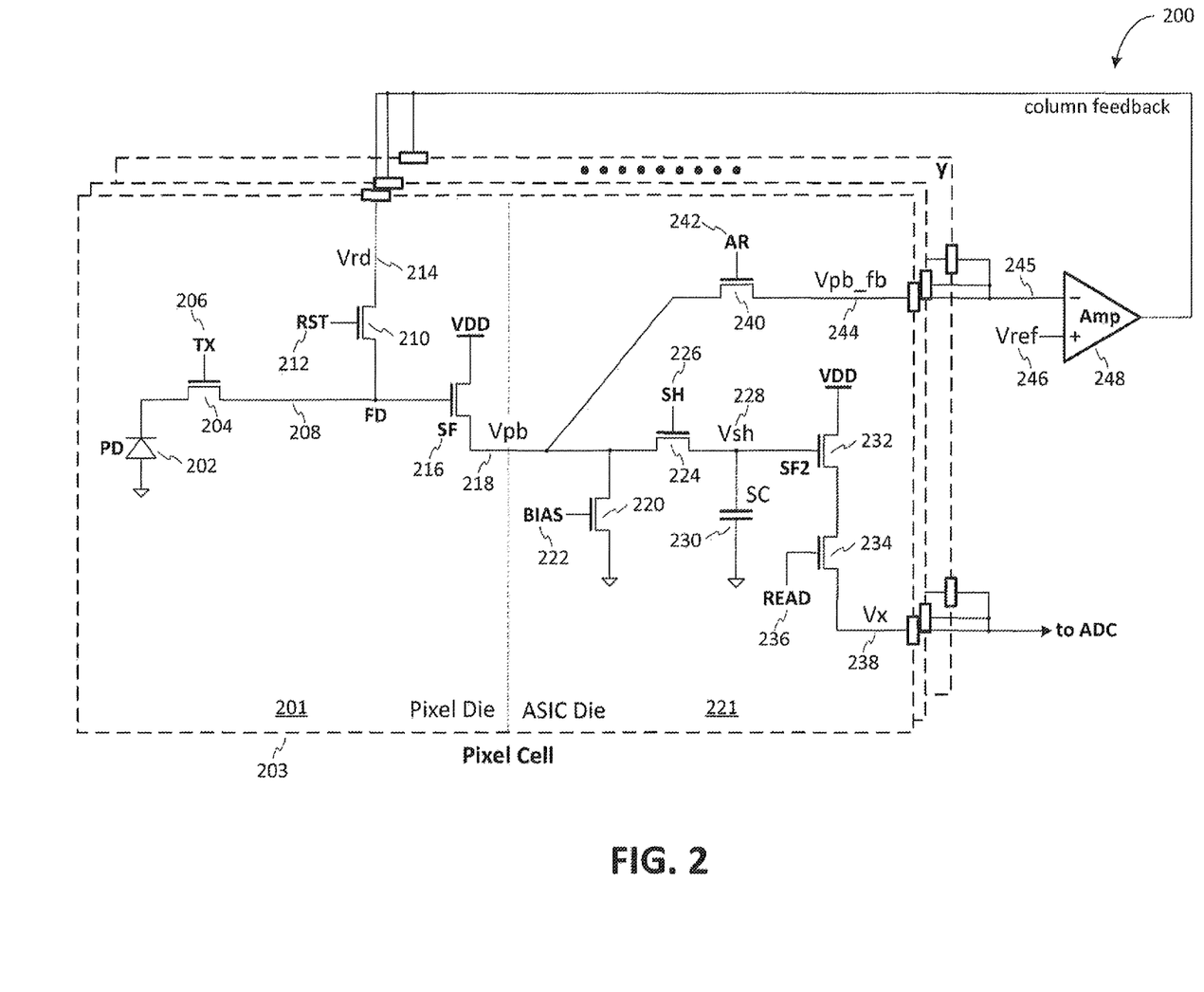
FIG. 2 is an example schematic of a block diagram of a column of pixel cells and an active reset circuit in an imaging sensor that is capable of actively reset a plurality of floating diffusions (FDs) through a column feedback loop in accordance with an embodiment of the present disclosure.

FIG. 2 is an example of block diagram of a pixel cell 103 of a column of pixel cells and an column active reset circuit in an imaging sensor that is capable of actively reset a column of floating diffusions (FDs) 208 through a column feedback loop, in accordance with an embodiment of the present disclosure. The illustrated embodiment of column feedback imaging system 200 may comprise a column of detecting photodiodes (PDs) 202 and a column of 3-transistor (3T) pixels configuration, where each 3T pixel configuration may include a transfer (TX) transistor 204, a reset (RST) transistor 210, and a first source follower (SF) transistor 216. The PD 202, the TX transistor 204, the RST transistor 210 and the SF transistor 216 are integrated in a pixel die 201.

When exposed to incident light, photo-generated signal charges accumulated at the PD 202 are transferred to the FD 208 through the TX transistor 204. The TX transistor 204 is switched on by applying a high voltage to a TX gate 206 of the TX transistor 204. The RST transistor 210 is switched on by applying a high voltage to a RST gate 212 of the RST transistor. When the RST transistor is switched on, a reset drive voltage Vrd from the reset drive input 214 resets the FD 208 to the Vrd. A gate terminal of the SF transistor 216 is connected to the FD 208. A drain terminal of the SF transistor 216 is connected to a power supply voltage VDD. The control circuitry 104 (see FIG. 1) controls respective voltages applied to the TX gate 206 and the RST gate 212. A source terminal of the SF transistor 216 is connected to a pixel bitline 218 to provide amplified signal voltage Vpb based on charges presented on the FD 208, as shown in FIG. 2.

A sample and hold (SH) transistor 224 connects between the pixel bitline 218 and a gate terminal of a second SF transistor 232. The SH transistor 224 is switched on by applying a high voltage to a SH gate 226 of the SH transistor 224. A storage capacitor (SC) 230 is connected between the gate of the second SF transistor 232 and a circuit ground. When the SH transistor 224 is switched on and off by toggling the voltage of the SH gate to high and low, the pixel bitline voltage Vpb on the pixel bitline 218 is sampled and held (stored) in the SC 230 as a voltage Vsh 228.

A readout (RO) transistor 234 is connected between the source terminal of the second SF transistor 232 and the pixel signal output 238. When the RO transistor 234 is switched on by applying a high voltage to the RO gate 236 of the RO transistor 234, the pixel signal voltage Vx at the pixel signal output 238 is an amplified voltage Vsh 228 held on the SC 230 based on the previous voltage sampled. A drain terminal of the second SF transistor 232 is connected to the VDD.

A bias transistor 220 is connected between the pixel bitline 218 and the ground. The bias transistor 220 maintains a proper operational current to the first SF transistor 216 by adjusting the voltage BIAS applied to the gate 222 of the bias transistor 220.

An active reset (AR) transistor 240 connects between the pixel bitline 218 and the pixel bitline feedback output 244. When the AR transistor 240 is switched on by applying a high voltage to the AR gate 242 of the AR transistor 240, the pixel bitline voltage Vpb on the pixel bitline 218 is presented as a pixel bitline feedback voltage Vpb_fb on the pixel bitline feedback output 244.

The control circuitry 104, as shown in FIG. 1, controls respective voltages applied to the bias gate 222, the SH gate 226, the RO gate 236, and the AR gate 242. The bias transistor 220, the SH transistor 224, the storage capacitor SC 230, the second SF transistor 232, the RO transistor 234, and the AR transistor 240 are integrated in an ASIC die 221.

A column amplifier 248 of a plurality of column amplifiers is connected between the pixel bitline feedback outputs 244 of a column of pixel cells 203 and the reset drive inputs 214 of the column of pixel cells 203, wherein the column of pixel cells is a column of a plurality of readout columns 110. The column amplifier 248 is a differential amplifier. In one example, the column amplifier 248 may be an operational amplifier (op amp). The inverting input of the op amp 248 is connected to each pixel bitline feedback output 244 of a plurality of pixel bitline feedback outputs of a plurality of pixel cells 203 arranged in the same column of a plurality of readout columns 110. The non-inverting input of the op amp 248 is connected to a reference voltage Vref. The output of the op amp 248 is connected to each reset drive input 214 of a plurality of reset drive inputs of a plurality of pixel cells 203 arranged in the same column of a plurality of readout columns 110.

Figure 3:
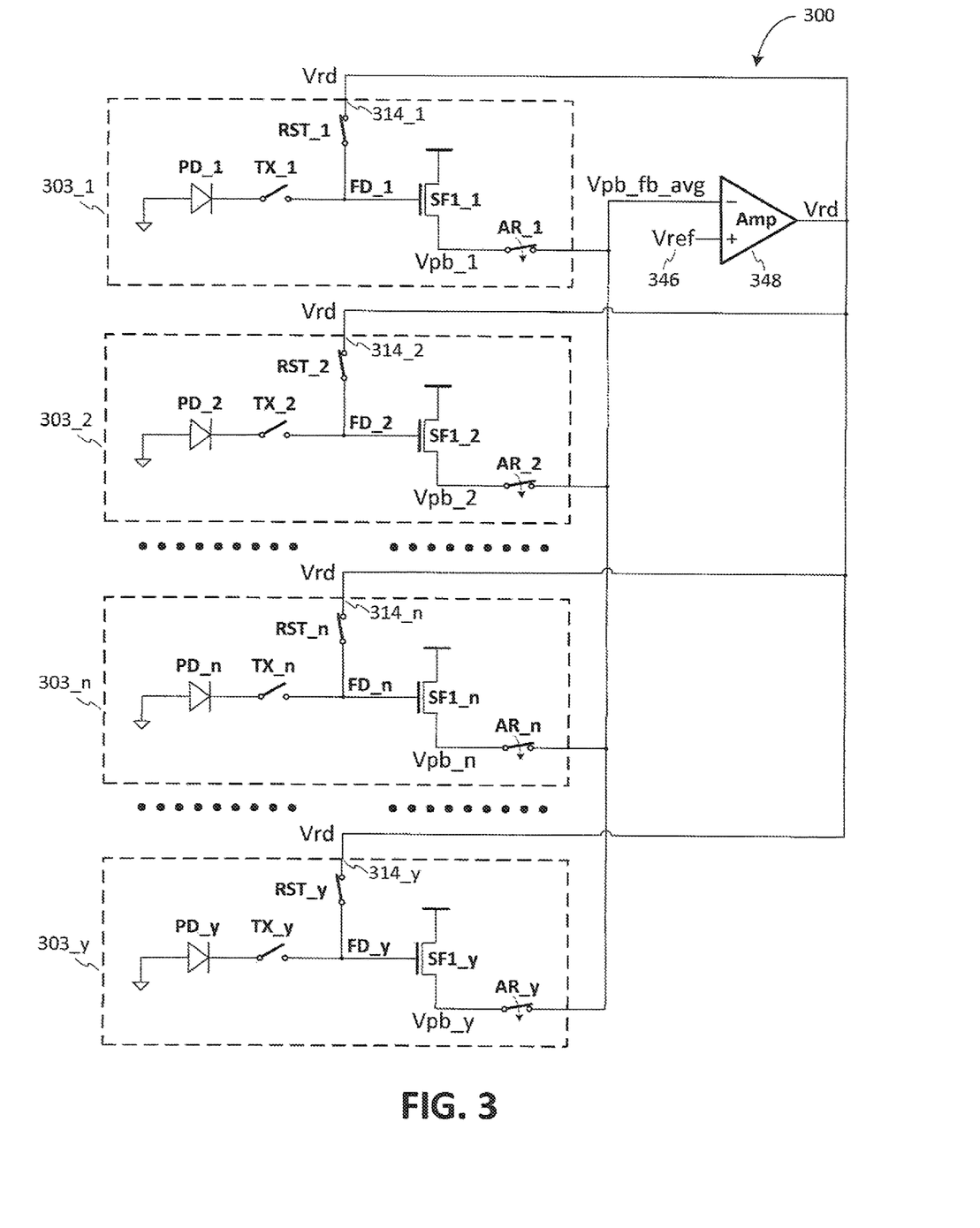
FIG. 3 is an illustrative global active reset signal readout configuration of a column of pixel cells arranged in each column of a plurality of readout columns 110 in an imaging sensor, in accordance with a first embodiment of the present disclosure.

FIG. 3 is an illustrative global active reset signal readout configuration 300 of the plurality of pixel cells 303_1 through 303_y arranged in the same column of a plurality of readout columns 110 in an imaging sensor that read both image signals and reset signals out globally, in accordance with an embodiment of the present disclosure. In FIG. 3, each readout column 110 connects to y pixel cells 303_1 through 303_y. All the y reset drive inputs 314_1 through 314_y (314_1-y) of each pixel cells 303_1 through 303_y (303_1-y) are connected to the output of a shared column op amp 348. Therefore, the reset levels of all pixel cells 303_1-y in the same column are set to the same column reset drive voltage Vrd.

Figure 4:
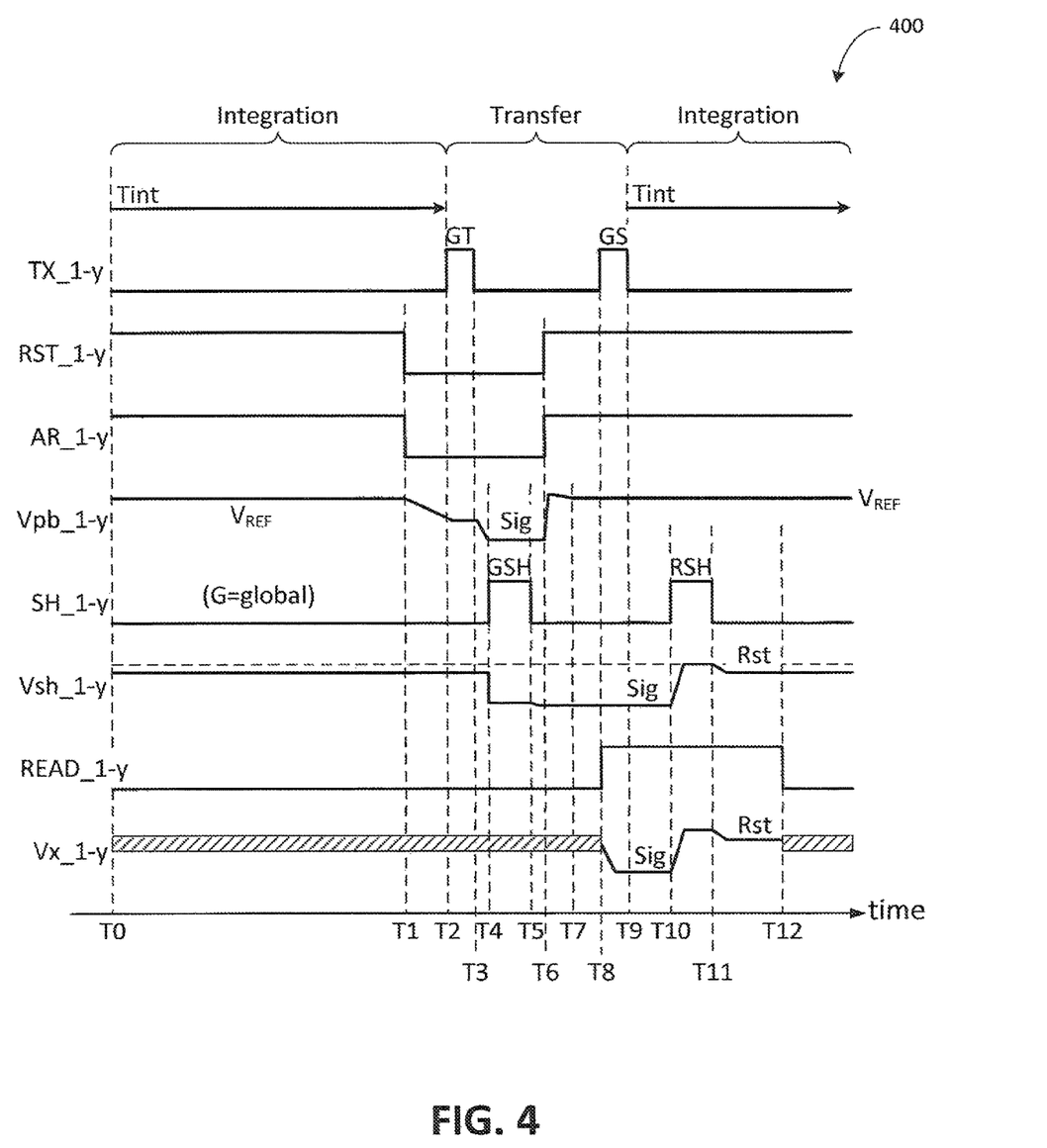
FIG. 4 is a first example timing diagram in association with the global active reset signal readout operation of a column of pixel cells arranged in each column of a plurality of readout columns 110 in an imaging sensor in associate with the column feedback circuit of FIG. 2 and the global reset configuration of FIG. 3, in accordance with the first embodiment of the present disclosure.

To better understand FIG. 3 and the sequence it is capable of, a timing diagram 400 is provided in FIG. 4 to explain all major events that take place in FIG. 3 in conjunction with FIG. 2.

At time T0, all 1 through y photodiodes PD_1 through PD_y of pixel cells 303_1-y of a readout column 110 start to integrate photo-generated electrons based on the incident light. Meanwhile, all 1 through y TX transistors TX_1-y are switched off by maintaining a low voltage to their gate terminals 206, and all 1 through y RST transistors RST_1-y are switched on by maintaining a high voltage to their gate terminals 212 to reset a plurality of floating diffusions FD_1-y to Vrd, and all 1 through y AR transistors AR 1-y are switched on by maintaining a high voltage to their gate terminals 242 to provide a reference voltage VREF to a plurality of RST drain terminals 214 of RST transistors 210 in a same column. Since a reference voltage Vref 346 is applied to the non-inverting input of the op amp 348, all 1 through y pixel bitline voltages Vpb_1-y 218 and pixel bitline feedback voltages Vpb_fb_1-y 244 are maintained near Vref by the op amp 348 at its inverting input 245 when the op amp 348 has high enough open-loop gain. Also at T0, all 1 through y SH transistors SH_1-y are switched off by maintaining a low voltage to their gate terminals 226, and all 1 through y RO transistors RO_1-y are switched on by maintaining high voltages to their gate terminals 236.

At time T1, all 1 through y RST transistors RST_1-y are switched off by changing their gate voltages from high to low, and all 1 through y AR transistors AR_1-y are switched off by changing their gate voltages from high to low. These two switch-off actions terminate the initial reset process to all the floating diffusions FD_1-y.

Between T2 and T3, a voltage pulse GT is applied to all the TX_1-y gate terminals to cause a global transfer of all photo-generated electrons accumulated from PD_1-y to FD_1-y, respectively. At T4, image signals caused by the integration of the incident light have been stabilized as pixel bitline voltages Vpb_1-y. Between T4 and T5, a voltage pulse GSH is globally applied to the gate terminals of all 1 through y SH transistors SH_1-y 224. At T6, SH voltages Vsh_1-y which reflect the Vpb_1-y are stabilized and stored into all the corresponding storage capacitors SC_1-y 230 globally as image signal voltages. Therefore at T6, for each individual pixel cell 303_n, $$(Vsh\_n)_{SIG} = Vrd - \Delta Vpd\_n - V_{TSF\_n} \quad (1)$$

Where $\Delta Vpd\_n$ represents the signal voltage at FD_n caused by the photo-generated electrons accumulated on PD_n, and $V_{TSF\_n}$ is the gate-to-source threshold voltage of transistor SF1_n.

At this point, for the CDS, the image signal voltages $(Vsh\_1-y)_{SIG}$ of equation (1) have been achieved globally, the process moves on to globally acquire the reset signal voltages $(Vsh\_1-y)_{RST}$ for the CDS. Also at T6, RST transistors RST_1-y are switched on by changing their gate voltages from low to high, and AR transistors AR 1-y are switched on, as shown exactly in FIG. 3, by changing their gate voltages from low to high. These two switch-on actions by RST_1-y and AR_1-y reset all the floating diffusions FD_1-y to the column reset drive voltage Vrd.

At T7, pixel bitline voltages Vpb_1-y are driven to near Vref by the op amp 348.

At T8, all the RO transistors 234 are switched on by applying a high voltage to their gate terminals READ_1-y 236.

Between T8 and T9, a voltage pulse GS is applied to all TX gate terminals to initiate a global shutter (GS) to PD_1-y. This action resets all PD_1-y and FD_1-y simultaneously. At T9, a new round of integration of photo-generated electrons to all PD_1-y may start.

Between T9 and T10, pixel signal voltages Vx_1-y related to $(Vsh\_1-y)_{SIG}$ of equation (1) are presented at corresponding pixel signal outputs 238. They may be further converted to digital signals by an ADC 150 in the readout circuitry 106 which is associated with the corresponding readout column 110.

Between T10 and T11, a reset voltage pulse RSH is applied to the gate terminals of all 1 through y SH transistors 224. Not long after T11, SH voltages Vsh_1-y which reflect the reset voltages of FD_1-y are stabilized and pixel reset (RST) voltages Vx_1-y related to $(Vsh\_1-y)_{RST}$ are presented at corresponding pixel signal outputs 238. Therefore, for each individual pixel cell 303_n, $$(Vsh\_n)_{RST} = Vrd - V_{TSF}\_\text{avg} \quad (2)$$

Where $V_{TSF}\_\text{avg}$ represents the averaged threshold voltage of all transistors SF1_1-y in the same readout column 110.

At T12, all the RO transistors 234 are switched off by applying a low voltage to their gate terminals READ_1-y 236.

To apply the concept of CDS, the final image signal of each individual pixel cell 303_n by combining equations (1) and (2) leads to $$(Vsh\_n)_{RST} - (Vsh\_n)_{SIG} = \Delta Vpd\_n + (V_{TSF\_n} - V_{TSF}\_\text{avg}) \quad (3)$$

Where $\Delta Vpd\_n$ represents the signal voltage at FD_n purely caused by the photo-generated electrons accumulated on PD_n which is the demanded image signal. $(V_{TSF}\_n - V_{TSF}\_\text{avg})$ represents a noise voltage associated with the readout which contribute to the vertical fixed pattern noise (VFPN) of the 2D image. To reduce VFPN, noise $(V_{TSF}\_n - V_{TSF}\_\text{avg})$ in equation (3) should be minimized. If all transistors SF1_1-y have smaller $V_{TSF}\_1-y$ variations among themselves, noise voltage $(V_{TSF}\_n - V_{TSF}\_\text{avg})$ may be greatly reduced. $V_{TSF}\_1-y$ variations may be reduced by using larger sized SF transistors SF1_1-y.

Figure 5:
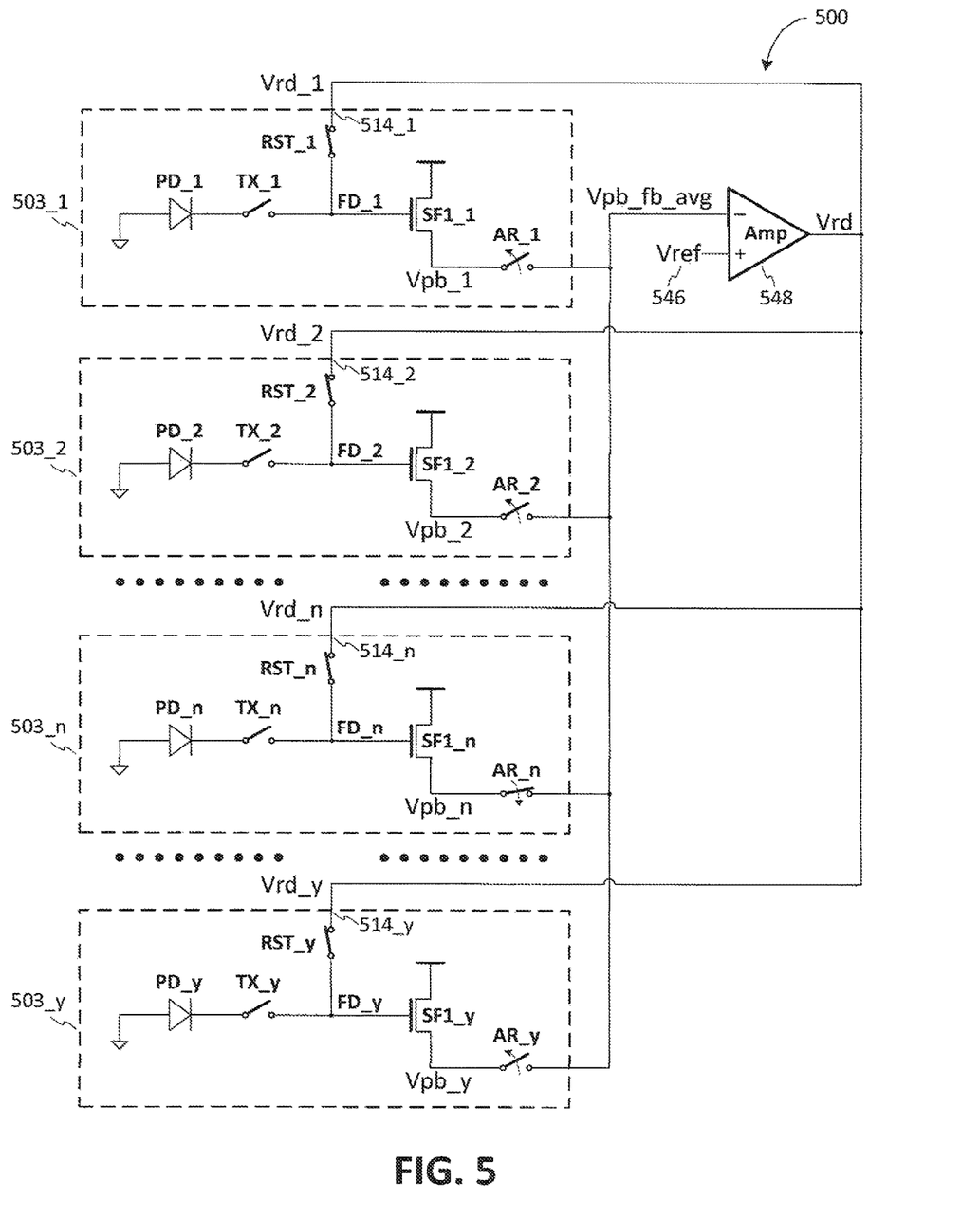
FIG. 5 is an illustrative row-by-row active reset signal readout configuration of a column of pixel cells arranged in each column of a plurality of readout columns 110 in an imaging sensor, in accordance with a second embodiment of the present disclosure.

FIG. 5 is an illustrative signal readout configuration 500 of a column of pixel cells 503_1 through 503_y arranged in the same column of a plurality of readout columns 110 in an imaging sensor which read image signals out globally and read reset signals out in a row-by-row method, in accordance with an embodiment of the present disclosure. In FIG. 5, each readout column 110 connects to y pixel cells 503_1 through 503_y. All the y reset drive inputs 514_1 through 514_y (514_1-y) of each column pixel cells 503_1 through 503_y (503_1-y) are connected to the output of a shared column op amp 548. Therefore, the plurality of reset drive voltages of all pixel cells in the same column are set to the same voltage Vrd.

Figure 6:
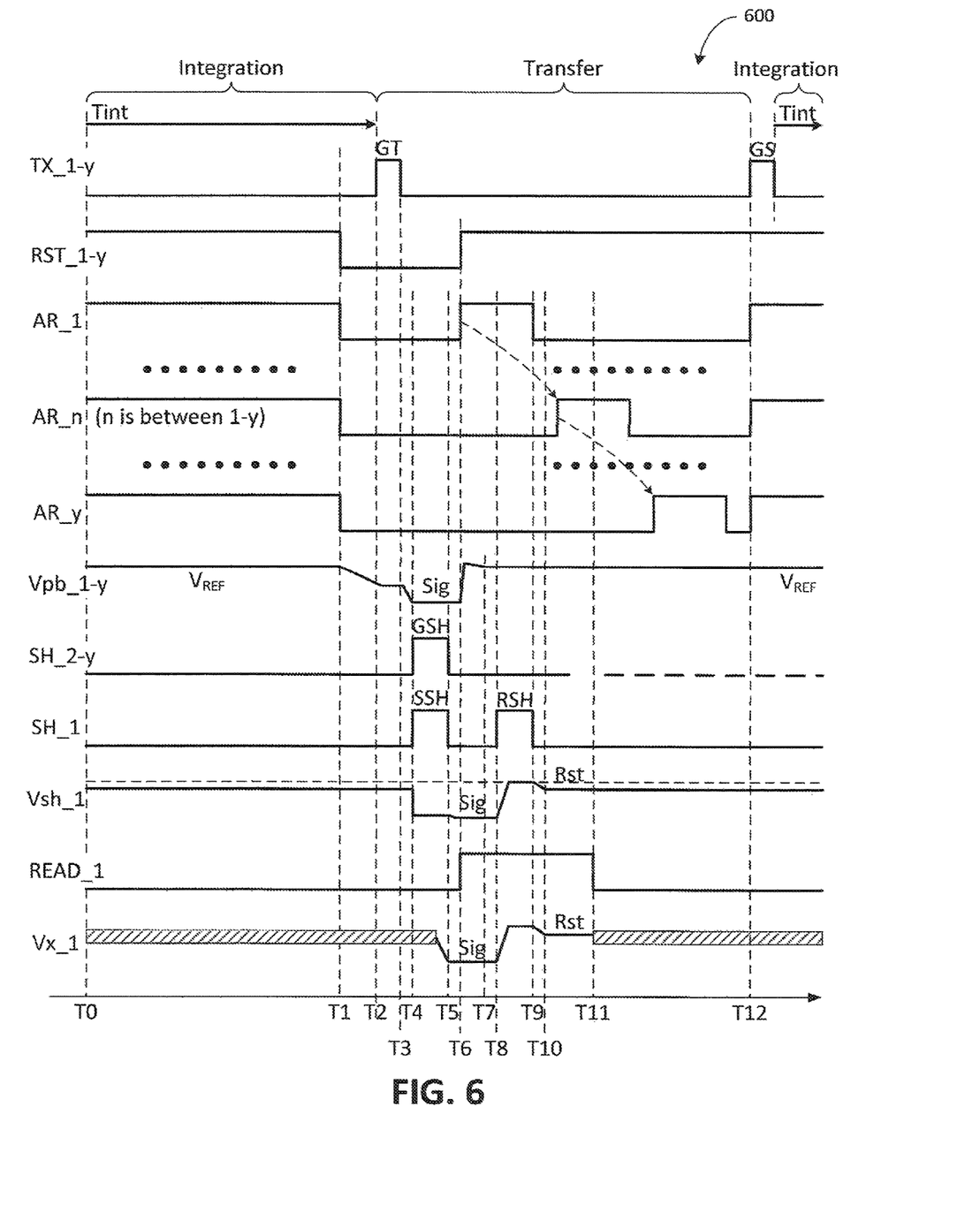
FIG. 6 is a second example timing diagram in association with the row-by-row active reset signal readout operation of a column of pixel cells arranged in each column of a plurality of readout columns 110 in an imaging sensor in associate with the column feedback circuit of FIG. 2 and the row-by-row reset configuration of FIG. 5, in accordance with the second embodiment of the present disclosure.

To better understand FIG. 5 and the sequence it represents, a timing diagram 600 is provided in FIG. 6 to explain all major events that take place in FIG. 5 in conjunction with FIG. 2.

At time T0, all 1 through y column photodiodes PD_1 through PD_y of column pixel cells 503_1-y connected to the same readout column 110 start to integrate photo-generated electrons based on the incident light. Meanwhile, all 1 through y TX transistors TX_1-y are switched off by maintaining low voltages to their gate terminals, and all 1 through y RST transistors RST_1-y are switched on by maintaining high voltages to their gate terminals, and all 1 through y AR transistors AR_1-y are switched on by maintaining high voltages to their gate terminals. Since a reference voltage Vref 546 is applied to the non-inverting input of the op amp 548, all 1 through y pixel bitline voltages Vpb_1-y are maintained near Vref by the op amp 548 at its inverting input. This is achieved by sharing the same column reset drive voltage Vrd presented at the column reset drive inputs 514_1-y of each pixel cells 503_1-y.

At time T1, all 1 through y RST transistors RST_1-y are switched off by changing their gate voltages from high to low, and all 1 through y AR transistors AR_1-y are switched off by changing their gate voltages from high to low. These two switch-off actions terminate the initial reset process to all the floating diffusions FD_1-y.

Between T2 and T3, a voltage pulse GT is applied to all the TX gate terminals to cause a global transfer (GT) of all photo-generated electrons accumulated on PD_1-y to flow into FD_1-y, respectively. At T4, image signals caused by the integration of the incident light have been stabilized as pixel bitline voltages Vpb_1-y. Between T4 and T5, a global voltage pulse GSH is applied to the gate terminals 226 of all 1 through y SH transistors 224 globally. At T6, SH voltages Vsh_1-y which reflect the Vpb_1-y are stabilized and stored into all the corresponding storage capacitors SC_1-y 230 globally as image signal voltages. Therefore at T6, for each individual pixel cell 503_n, $$(Vsh\_n)_{SIG} = Vrd - \Delta Vpd\_n - V_{TSF\_n} \tag{4}$$

Where $\Delta Vpd\_n$ represents the signal voltage at FD_n caused by the photo-generated electrons accumulated on PD_n, and $V_{TSF\_n}$ is the gate-to-source threshold voltage of transistor SF1_n.

At this point, for the CDS, the image signal voltages $(Vsh\_1\text{-}y)_{SIG}$ of equation (4) have been achieved globally, the process moves on to acquire the reset signal voltages $(Vsh\_1\text{-}y)_{RST}$ for the CDS in a row-by-row fashion. Also at T6, RST transistors RST 1-y are switched on by changing their gate voltages from low to high, and AR transistor AR_1 is switched on by changing its gate voltage from low to high. These two switch-on actions by RST_1-y and AR_1 reset the floating diffusions FD_1 to voltage Vrd. Also at T6, all the RO transistors 234 are switched on by applying a high voltage to their gate terminals READ_1-y 236. A plurality of amplified SH voltages Vsh_1-y is read to a plurality of pixel signal outputs 238, wherein the plurality of amplified SH voltages Vsh_1-y is amplified by a plurality of second SF transistors 232 based on the plurality of SH voltages Vsh_1-y which are held in the plurality of storage capacitors 230.

At T7, pixel bitline voltage Vpb_1 is driven to near Vref by the op amp 548.

Between T6 and T8, pixel signal voltages Vx_1-y related to $(Vsh\_1\text{-}y)_{SIG}$ of equation (4) are presented at corresponding pixel signal outputs 238. They may be further converted to digital signals by an ADC 150 in the readout circuitry 106 which is associated with the corresponding readout column 110.

Between T8 and T9, a voltage pulse RSH is applied to the gate terminal of SH transistor SH_1 224. At T9, transistor AR_1 is switched off by changing their gate voltages from high to low. At T10, SH voltage Vsh_1 which reflect the reset voltage of FD_1 is stabilized and pixel reset (RST) voltage Vx_1 related to $(Vsh\_1)_{RST}$ is presented at corresponding pixel signal output 238. Therefore between T10 and T11, for pixel cell 503_1, $$(Vsh\_1)_{RST} = Vrd\_1 - V_{TSF\_1} \tag{5}$$

Where Vrd_1 represents the reset drive voltage at reset drive input 514_1 of pixel cell 503_1, and $V_{TSF\_}$1 represents the gate-to-source threshold voltage of transistor SF1_1 of the readout column 110.

After $(Vsh\_1)_{RST}$ is acquired, $(Vsh\_2)_{RST}$ is acquired subsequently. Soon after T10, AR transistor AR_2 is switched on by changing its gate voltage from low to high. The AR_2 sets the floating diffusions FD_2 to voltage Vrd_2. Similar to the measurement for $(Vsh\_1)_{RST}$, Vpb_2 is driven to near Vref by the op amp 548. A voltage pulse RSH is applied to the gate terminal 226 of SH transistor SH_2 224, to toggle transistor AR_2 on and off. As a result of the toggling of SH_2 224, SH voltage Vsh_2 which reflect the reset voltage of FD_2 is stabilized and pixel reset (RST) voltage Vx_2 related to $(Vsh\_2)_{RST}$ is presented at corresponding pixel signal output 238. As a consequence, for pixel cell 503_2, $$(Vsh\_2)_{RST} = Vrd\_2 - V_{TSF\_2} \tag{6}$$

Where Vrd_2 represents the reset drive voltage at reset drive input 514_2 of pixel cell 503_2, and $V_{TSF\_}$2 represents the gate-to-source threshold voltage of transistor SF1_2 of the readout column 110.

As the similar process acquiring $(Vsh\_n)_{RST}$ repeats itself continuously to the nth pixel cell 503_n (n is between 1 and y), the AR_n sets the floating diffusions FD_n to voltage Vrd_n, as shown exactly by FIG. 5. Similar to the previous acquirements for $(Vsh\_1)_{RST}$ and $(Vsh\_2)_{RST}$, Vpb_n is driven to near Vref by the op amp 548. A voltage pulse RSH is applied to the gate terminal 226 of SH transistor SH_n 224, to toggle transistor AR_n on and off. As a result of the toggling of SH_n 224, SH voltage Vsh_n which reflect the reset voltage of FD_n is stabilized and pixel reset (RST) voltage Vx_n related to $(Vsh\_n)_{RST}$ is presented at corresponding pixel signal output 238. As a consequence, similar to equations (5) and (6), for pixel cell 503_n, $$(Vsh\_n)_{RST} = Vrd\_n - V_{TSF\_n} \tag{7}$$

Where Vrd_n represents the reset drive voltage at reset drive input 514_n of pixel cell 503_n, and $V_{TSF\_}$n represents the gate-to-source threshold voltage of transistor SF1_n of the readout column 110.

The repeatable acquirement may conclude by acquiring $(Vsh\_y)_{RST}$ of the reset voltage of FD_y. And presenting $(Vsh\_y)_{RST}$ at pixel signal output 238_y. At this point all $(Vsh\_1\text{-}y)_{RST}$ of the reset voltage of FD_1 through FD_y are presented to corresponding pixel signal outputs 238_1 through 238_y, respectively when RO transistors 234_1 through 234_y are switched on and off by applying a voltage pulse to their corresponding gate terminals READ_1 through READ_y 236, row-by-row.

To apply the concept of CDS, the final image signal of each individual pixel cell 503_n by combining equations (4) and (7) leads to $$(Vsh\_n)_{RST} - (Vsh\_n)_{SIG} = \Delta Vpd\_n + (Vrd\_n - Vrd) \quad (8)$$

Where ΔVpd_n represents the signal voltage at FD_n purely caused by the photo-generated electrons accumulated on PD_n which is the most demanded image signal. (Vrd_n–Vrd) represents a noise voltage associated with the readout that contribute to the fixed pattern noise (FPN) of the 2D image. To reduce FPN, noise voltage (Vrd_n–Vrd) of equation (8) should be minimized, or it is good to have each individual value Vrd_n closest to the Vrd. Vrd is a column reset drive voltage shared by all column pixel cells 503_1-y during the initial global reset process between T0 and T1 as shown in FIG. 6.

If each of the transistors SF1_1-y manage to have smaller $V_{TSF}\_1$-y variations among themselves, noise voltage (Vrd_n–Vrd) in equation (8) may be greatly reduced. The $V_{TSF}\_1$-y variations may be reduced by using larger sized transistors for RST_1-y 210, SF1_1-y 216, and the op amp 248.

At T12, each column amplifier 248 is connected to the corresponding pixel bitline feedback output 244 by setting a high voltage to the corresponding AR gate terminal 242 to switch on the corresponding AR transistor 240. Also at T12, each FD 208 is still reset to the reset drive voltage Vrd received at the reset drive input 214 since the RST transistor 214 remains on since T6 by maintaining a high voltage to the RST gate terminal 212, and each PD 202 is reset to Vrd by toggling the voltage of the TX gate terminal 206 to high and low to switch the TX transistor 204 on and off. After the TX transistor 204 settles to its off state, a new round of charge integration may begin from Tint on each PD 202 of the pixel array 102 in react to any incident light.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell of an image sensor, comprising:
    a photodiode (PD) adapted to accumulate image charges in response to incident light;
    a transfer (TX) transistor coupled between the PD and a floating diffusion (FD) to transfer image charges from the PD to the FD, wherein a TX gate voltage controls transmission of the image charges from the PD to the FD;
    a reset (RST) transistor coupled between a reset drive input and the FD to supply a reset drive voltage to the FD, wherein a RST gate voltage controls the RST transistor;
    a first source follower (SF) transistor coupled to receive a FD voltage from a first SF gate terminal and provide an amplified signal voltage to a first SF source terminal;
    a sample and hold (SH) circuit coupled between the first SF source terminal and a second SF gate terminal of a second SF transistor;
    a readout (RO) transistor coupled between a second SF source terminal of the second SF transistor and a pixel signal output, wherein a RO gate voltage controls a transmission of an amplified sample and hold signal voltage from the second SF source terminal to the pixel signal output; and
    an active reset (AR) transistor coupled between the first SF source terminal and a pixel bitline feedback output, wherein an AR gate voltage controls a transmission of a pixel bitline voltage, which is the amplified signal voltage, from the first SF source terminal to the pixel bitline feedback output.

2. The pixel cell of an image sensor of claim 1, wherein the PD, the TX transistor, the RST transistor, and the SF transistor are integrated in a pixel die.

3. The pixel cell of an image sensor of claim 1, further comprising a bias transistor coupled between the first SF source terminal and a ground.

4. The pixel cell of an image sensor of claim 3, wherein the bias transistor is integrated in an ASCI die.

5. The pixel cell of an image sensor of claim 1, wherein the SH circuit comprises
    a SH transistor coupled between the first SF source terminal and the second SF gate terminal; and
    a storage capacitor coupled between the second SF gate terminal and a ground.

6. The pixel cell of an image sensor of claim 5, wherein the SH transistor, the storage capacitor, the second SF transistor, the RO transistor, and the AR transistor are integrated in an ASCI die.

7. An imaging system, comprising:
    a pixel array having a plurality of pixel cells arranged into a plurality of rows and a plurality of columns, wherein each one of the plurality of pixel cells comprises:
        a photodiode (PD) adapted to accumulate image charges in response to incident light;
        a transfer (TX) transistor coupled between the PD and a floating diffusion (FD) to transfer image charges from the PD to the FD, wherein a TX gate voltage controls a transmission of the image charges from the PD to the FD;
        a reset (RST) transistor coupled between a reset drive input and the FD to supply a column reset drive voltage to the FD, wherein a RST gate voltage controls the RST transistor;
        a first source follower (SF) transistor coupled to receive a FD voltage from a first SF gate terminal and provide an amplified signal voltage to a first SF source terminal;
        a sample and hold (SH) circuit coupled between the first SF source terminal and a second SF gate terminal of a second SF transistor;
        a readout (RO) transistor coupled between a second SF source terminal of the second SF transistor and a pixel signal output, wherein a RO gate voltage controls a transmission of an amplified sample and hold signal voltage from the second SF source terminal to the pixel signal output; and
        an active reset (AR) transistor coupled between the first SF source terminal and a pixel bitline feedback output, wherein an AR gate voltage controls a transmission of a pixel bitline voltage, which is the amplified signal voltage, from the first SF source terminal to the pixel bitline feedback output;

a control circuitry coupled to the pixel array to control operation of the pixel array, wherein the control circuitry controls the TX gate voltage, the RST gate voltage, operation of the SH circuit, the RO gate voltage, and the AR gate voltage;

a readout circuitry coupled to the pixel array through a plurality of readout columns to read out image data from a plurality of columns of pixel cells and to supply a plurality of reset drive voltages to each corresponding column of the plurality of columns of pixel cells; and a function logic coupled to receive image data of each one of the plurality of pixel cells from the readout circuitry and to store the received image data.

8. The imaging system of claim 7, wherein the PD, the TX transistor, the RST transistor, and the first SF transistor are integrated in a pixel die.

9. The imaging system of claim 7, each pixel cell of the plurality of pixel cells further comprising a bias transistor coupled between the first SF source terminal and a ground, wherein a bias gate voltage controls a bias current of the first SF transistor.

10. The imaging system of claim 9, wherein the bias transistor is controlled by the control circuitry and is integrated in an ASCI die.

11. The imaging system of claim 7, wherein the SH circuit of each one of the plurality of pixel cells comprises
a storage capacitor coupled between the second SF gate terminal and a ground; and
a SH transistor coupled between the first SF source terminal and the second SF gate terminal, wherein a SH gate voltage controls a transmission of the pixel bitline voltage, which is the amplified signal voltage, from the first SF source terminal to the storage capacitor.

12. The imaging system of claim 11, wherein the SH transistor, the storage capacitor, the second SF transistor, the RO transistor, and the AR transistor are integrated in an ASCI die.

13. The imaging system of claim 7, wherein the function logic provides instructions to the control circuitry.

14. The imaging system of claim 7, wherein each readout column of the plurality of readout columns comprises
a pixel signal conductor coupled to each pixel signal output of a plurality of pixel signal outputs associated with corresponding readout column;
a bitline feedback conductor coupled to each pixel bitline feedback output of the plurality of pixel bitline feedback outputs associated with corresponding readout column; and
a reset drive conductor coupled to each reset drive input of the plurality of reset drive inputs associated with corresponding readout column.

15. The imaging system of claim 7, the readout circuitry further comprising a plurality of column amplifiers, wherein each column amplifier of the plurality of column amplifiers is coupled between a corresponding pixel feedback conductor of a plurality of pixel feedback conductors, and a corresponding reset drive conductor of a plurality of reset drive conductors.

16. The imaging system of claim 15, wherein each column amplifier of the plurality of column amplifiers is an operational amplifier, and wherein an inverting input of the operational amplifier is coupled to a pixel bitline feedback conductor of the corresponding column and a non-inverting input of the operational amplifier is coupled to a reference voltage.

17. The imaging system of claim 15, wherein the column amplifier is integrated in an ASIC die.

18. The imaging system of claim 7, wherein the readout circuitry further comprises:
a plurality of pre-ADC circuitry; and
a plurality of analog-to-digital converters (ADCs), wherein each pre-ADC circuitry of the plurality of pre-ADC circuitry is coupled between each pixel signal conductor of a plurality of pixel signal conductors and each ADC of the plurality of ADCs.

19. A method of reading image signal, comprising:
maintaining a low voltage to a plurality of transfer (TX) gate terminals to switch off a plurality of TX transistors;
maintaining a high voltage to a plurality of reset (RST) gate terminals to switch on a plurality of RST transistors to reset a plurality of floating diffusions (FDs) with a corresponding column reset drive voltage of a plurality of column reset drive voltages;
maintaining a high voltage to a plurality of active reset (AR) gate terminals to switch on a plurality of AR transistors to feed the corresponding column reset drive voltage of the plurality of column reset drive voltages back to a plurality of RST drain terminals of RST transistors;
maintaining a low voltage to a plurality of sample and hold (SH) gate voltages to switch off a plurality of SH transistors;
maintaining a low voltage to a plurality of readout (RO) gate terminals to switch off a plurality of RO transistors;
disconnecting the plurality of FDs from the plurality of column reset drive voltages by setting a low voltage to a plurality of RST gate terminals to switch off the plurality of RST transistors;
disconnecting a plurality of column amplifiers from a plurality of pixel bitline feedback outputs by setting a low voltage to the plurality of AR gate terminals to switch off the plurality of AR transistors;
transferring a plurality of charges from a plurality of photodiodes (PDs) to the plurality of FDs by toggling a voltage of the plurality of TX gate terminals to high and low to switch the plurality of TX transistors on and off; and
sampling and holding a plurality of first pixel bitline voltages from a plurality of first source followers (SFs) to a plurality of storage capacitors by toggling a voltage of the plurality of SH gate terminals to high and low to switch the plurality of SH transistors on and off.

20. The method of reading image signal of claim 19, further comprising:
connecting the plurality of FDs to a plurality of reset drive inputs coupled to corresponding outputs of the plurality of column amplifiers by setting a high voltage to the plurality of RST gate terminals to switch on the plurality of RST transistors; and
connecting the plurality of column amplifiers to the plurality of pixel bitline feedback outputs by setting a high voltage to the plurality of AR gate terminals to switch on the plurality of AR transistors.

21. The method of reading image signal of claim 20, further comprising:
reading a plurality of amplified first pixel bitline voltages to a plurality of pixel signal outputs by setting a high voltage to the plurality of RO gate terminals to switch on the plurality of RO transistors, wherein the plurality of amplified first pixel bitline voltages is amplified by a plurality of second SF transistors from the plurality of first pixel bitline voltages which are held in the plurality of storage capacitors.

22. The method of reading image signal of claim 21, further comprising:
resetting the plurality of PDs and FDs to start a new incident light integration by toggling a voltage of the plurality of TX gate terminals to high and low to switch the plurality of TX transistors on and off.

23. The method of reading image signal of claim 22, further comprising:
sampling and holding a plurality of second pixel bitline voltages to the plurality of storage capacitors by toggling a voltage of the plurality of SH gate terminals to high and low to switch the plurality of SH transistors on and off;
reading a plurality of amplified second pixel bitline voltages from the plurality of storage capacitors to the plurality of pixel signal outputs through the plurality of second SF transistors; and
setting a low voltage to the plurality of RO gate terminals to switch off the plurality of RO transistors.

24. The method of reading image signal of claim 19, further comprising:
connecting the plurality of FDs to a plurality of reset drive inputs coupled to corresponding outputs of the plurality of column amplifiers by setting a high voltage to the plurality of RST gate terminals to switch on the plurality of RST transistors.

25. The method of reading image signal of claim 24, further comprising:
reading a plurality of amplified first pixel bitline voltages to a plurality of pixel signal outputs by setting a high voltage to the plurality of RO gate terminals to switch on the plurality of RO transistors, wherein the plurality of amplified first pixel bitline voltages is amplified by a plurality of second SF transistors from a plurality of first pixel bitline voltages which are held in the plurality of storage capacitors.

26. The method of reading image signal of claim 25, further comprising:
a plurality of row operations conducted in sequence of starting in a first row and ending in a last row of a column of pixel cells of a plurality of columns of pixel cells, wherein a nth row operation of the plurality of row operations comprises:
connecting each of the plurality of column amplifiers to each of a plurality of nth pixel bitline feedback voltages by setting a high voltage to each of a plurality of nth AR gate terminals to switch on a plurality of nth AR transistors;
sampling and holding a plurality of nth second pixel bitline voltages to the plurality of nth storage capacitors by toggling a voltage of a plurality of nth SH gate terminals to high and low to switch a plurality of nth SH transistors on and off;
disconnecting the plurality of column amplifiers from the plurality of nth pixel bitline feedback voltages by setting a low voltage to the plurality of nth AR gate terminals to switch off the plurality of nth AR transistors;
reading a plurality of nth amplified second pixel bitline voltages from a plurality of nth storage capacitors to a plurality of nth pixel signal outputs through a plurality of nth second SF transistors; and
setting a low voltage to a plurality of nth RO gate terminals to switch off a plurality of nth RO transistors.

27. The method of reading image signal of claim 26, further comprising:
connecting the plurality of column amplifiers to a plurality of pixel bitline feedback voltages by setting a high voltage to the plurality of AR gate terminals to switch on the plurality of AR transistors; and
resetting the plurality of PDs to start a new incident light integration by toggling a voltage of the plurality of TX gate terminals to high and low to switch the plurality of TX transistors on and off.

* * * * *